United States Patent Office 3,418,118
Patented Dec. 24, 1968

3,418,118

PHOTOGRAPHIC PROCESSES AND PRODUCTS

Glen Anthony Thommes and Peter Walker, Red Bank, N.J., assignors to E. I. du Pont de Nemours and Company, Wilmington, Del., a corporation of Delaware No Drawing. Continuation-in-part of application Ser. No. 461,199, June 3, 1965. This application Oct. 22, 1965, Ser. No. 502,462
8 Claims. (Cl. 96—11)

This invention is a continuation-in-part of the earlier filed application Serial No. 461,199, filed June 3, 1965, by Thommes and Walker, and now abandoned.

This invention relates to new photopolymerizable compositions. It also relates to image-yielding photopolymerizable elements embodying photopolymerizable components. More particularly, the invention relates to photopolymerizable compositions and elements useful in the formation of colored images.

It is known that photopolymerization can be carried out in such a manner as to reproduce original text and pictorial matter. Practical applications of such a process have been disclosed, e.g., in the preparation of relief printing plates by wash-out of unpolymerized areas, thermal transfer of unpolymerized image areas, etc. In the compositions of the prior art, it is customary to employ homogeneous compositions wherein the polymerizable monomer, the photoinitiator, and the binder are all within a single phase. In such a single phase system it is known that severe inhibition of the polymerization reaction is caused by the presence of oxygen. Also, it has been found difficult to reproduce continuous tone images by homogeneous photopolymerization, a phenomenon which might be partially related to the oxygen inhibition effect.

An object of the present invention is the preparation of new photopolymerizable compositions and elements and the development of new image-yielding processes for using such elements. More specific objects are the preparation of photopolymerizable compositions and elements which show improved resistance to oxygen inhibition, improved photographic speed or sensitivity to light and which are useful in producing continuous tone images in color. Still further objects will be apparent from the following description of the invention.

These and other objects are accomplished by an image-forming photopolymerizable dispersion comprising an organic polymeric binder dispersion medium containing a dispersed phase having a nongaseous ethylenically unsaturated compound with a boiling point above 100° C. at normal pressure, being capable of forming a high polymer by free-radical initiated, chain-propagating, addition polymerization and in reactive association with sad ethylenically unsaturated compound a free-radical generating photoinitiator system, said dispersed phase containing part of a standard color system said part being incapable of singularly forming a color image.

The photoinitiator system includes (I) single photoinitiators which are raised to active states by actinic radiation and react directly with said unsaturated compound to induce polymerization and (II) combination photoinitiators having (a) a material which is raised to an active state by actinic radiation and (b) a free-radial producing agent initiated by said active state. Component (a) includes all of the single photoinitiators of (I) as well as other materials activatable by actinic radiation which can operate only in combination with component (b) to induce polymerization.

The above photoinitiating system may be "in reactive association" with the ethylenically unsaturated compound whether it is in the dispersion medium, in the dispersed phase, in both phases, or at the interface between the two phases.

Photographic elements prepared by applying a layer of the above composition to a suitable support may be made to yield images by imagewise exposure. The exposure to actinic radiation causes individual hardening of droplets of the dispersed phase by photopolymerization. This differential hardening of individual droplets constitutes an actual or latent image of proper gradation so that continuous tone reproduction is quite feasible.

Color image producing systems include any combinations of ingredients which, through chemical action, are capable of producing or destroying a colorant, i.e., a dye or a pigment or altering the absorption characteristics of a colorant in such a manner as to yield a color image corresponding to an exposure pattern. A preferred system is that used conventionally in color photography wherein a color former (or color coupler) reacts with a color developer after the latter has reacted with an oxidizing agent. At least one but not all of the three ingredients, i.e., color former, color developer or oxidizing agent, must be present in the photopolymerizable dispersed phase with the remaining ingredient(s) being present in the dispersion medium or in the processing solutions. The imagewise hardening of the dispersed phase droplets alters the rate of diffusion (either into or out of the droplets) of one or more of the ingredients of the color image-producing system so that chemical reaction occurs preferentially in areas which are least exposed. For example, a nonmigratory color former, within the dispersed droplets, couples in the presence of molecules of color coupler and oxidizing agent which diffuse from the processing solutions into the droplets, preferentially in unexposed areas. When a multilayer element is prepared, it is necessary to have in the dispersed phase of each layer a portion of the color system which will form only the desired color for that particular layer. For example, if the different color couplers in each layer are the type which will react with the same developer to form their respective colors then the couplers must be in the dispersed phase. If the color couplers react only with different developers to form their respective colors, then either the coupler or developer may be used in the dispersed phase.

Other types of color image-producing systems useful in this invention include diazonium salt plus azo dye coupler, leuco dye plus oxidizing agent, dye plus bleaching agent (wherein color is removed preferentially in unexposed areas), metachromatic dye plue reactive substrate, etc. In any such image-producing system, one of the ingredients must be present in the dispersed droplets and imagewise reaction occurs either (a) by differential diffusion of the ingredient out of the dispersed droplet or (b) by differential diffusion of a co-reacting ingredient into the dispersed droplet. Preferably, the processing solutions are aqueous; one of the reacting ingredients is readily diffusible in aqueous media while another reacting ingredient is relatively non-migratory.

Gelatin has frequently been used as the binder in an aqueous dispersion medium which contains (optionally) a surfactant or dispersant such as benzyl alcohol. The dispersed phase will then consist of oily droplets containing a polymerizable monomer such as pentaerythritol triacrylate, an incomplete color system and a photoinitiator system. Depending upon which initiating system is employed, a single component may be used such as the polynuclear quinones or a multiple component system having (1) (the material raised to an active state by actinic radiation) a dye, e.g., a cyanine, merocyanine, or photoreducible dye, while component (2) (the free-radical producing agent) may be selected from such components as carbon tetrabromide, triethanolamine or N-phenylglycine. In some instances, it has been found desirable to include other components in the dispersed phase, for example, a plasticizer, e.g., diisobutylphthalate, another binder such as methyl methacrylate resin, and a removable solvent, e.g., ethyl acetate.

The invention will be further illustrated but is not limited by the following examples wherein the dispersing media are the aqueous phases and the dispersed phases are nonaqueous. Similar results should be obtained if droplets of an aqueous phase were dispersed in a nonaqueous dispersion medium with suitable selections of nonaqueous processing solutions.

EXAMPLE I

A suspension of photopolymerizable droplets in aqueous gelatin binder was prepared by mixing two solutions at 95° F. in a high-speed blender (Waring Corp., New York, N.Y.). The first solution contained 14 g. of gelatin, 300 ml. of water, 0.1 g. of a surfactant (benzyl alcohol), 20 mg. of a dye (Methylene Blue, CI Basic Blue 9) and 0.5 g. of triethanolamine. The second solution contained 150 ml. of ethyl acetate, 10 g. of pentaerythritol triacrylate and 2 g. of a cyan color forming polymer.[1] The warm mixture was transferred to a rotary evaporator and ethyl acetate was stripped off at 122° F. and 10 mm. of mercury pressure.

The resulting photopolymerizable emulsion was skim coated (under safelight conditions) at 15 ft./min. and 95° F. on a 0.004 inch thick polyethylene terephthalate film support bearing a thin gelatin layer over a subcoat of a copolymer of vinylidene chloride/methyl acrylate/itaconic acid as disclosed in Example IV of Alles, U.S. Patent 2,779,684. The coating was dried and an approximately 0.0002 inch thick photopolymerizable layer resulted. The dry surface of said layer was brought into contact with a photographic positive transparency containing continuous tone images, and the film was exposed through the positive for 15 seconds to a high-intensity tungsten filament incandescent lamp (General Electric Reflector Photoflood lamp, No. PH/RFL2) at a distance of 10 inches, whereby photopolymerization took place in those droplets which were exposed to light. The exposed layer was then developed by successive immersions for periods of one minute in each of two solutions. The first was a color developer containing a solution of 60 g. of tribasic sodium phosphate, 1 g. of sodium sulphite and 5 g. of 4-amino-N-ethyl-N-(β-methanesulfonamidoethyl)-m-toluidine sesquisulfate monohydrate, in 1 liter of water at room temperature and adjusted to pH 11.5. The second solution contained 20 g. of potassium persulfate in 1 liter of water at room temperature. The developed material was water washed for 5 min. and dried to give a well-defined, cyan (blue-green) continuous tone copy of the original image.

EXAMPLE II

A suspension of photopolymerizable droplets in aqueous gelatin binder was prepared by mixing two solutions,

[1] A polymer prepared by copolymerizing 1.5 moles of ethyl acrylate with 1 mole of 1-hydroxy-N-(β-vinyloxyethyl)-2-naphthamide. Preparation of the monomeric naphthamide color former is disclosed in "Procedure A" of assignee's copending application of Umberger, Ser. No. 419,227, filed Dec. 17, 1964, now Patent No. 3,229,013. The polymerization was carried out in t-butanol solvent using azo-bis(isobutyronitrile) as a free-radical initiating catalyst.

at 95° F., in the high-speed blender of Example I. The first solution contained 14 g. of gelatin, 300 ml. of water, 0.1 g. of a surfactant (benzyl alcohol), 20 mg. of a dye (Safranin Bluish, C.I. Basic Violet 5) and 0.1 g. of triethanolamine. The second solution contained 10 ml. of pentaerythritol triacrylate and 2 g. of a magenta color-forming polymer.[2] The resulting photopolymerizable emulsion as skin coated at 15 ft./min. and 95° F. on the polyethylene terephthalate support described in Example I. The coating was dried and an approximately 0.001 inch thick photopolymerizable layer resulted. The film was exposed to the light from a projected transparency (500 w. projector lamp; 8× enlargement; 2-min. exposure). The exposed layer was developed as described in Example I to give a good continuous tone enlargement in a magenta color.

EXAMPLE III

The following solutions were prepared:

A.

| | | |
|---|---|---|
| Gelatin | g. | 18 |
| Water | ml. | 300 |
| Benzyl alcohol | g. | 0.5 |

B.

| | | |
|---|---|---|
| Ethyl acetate | ml. | 40 |
| Surfactant [1] | g. | 0.2 |
| Cyan color forming polymer of Example I | g. | 2.0 |
| Phenanthyrenequinone | g. | 0.5 |
| Pentaerythriotol triacrylate | g. | 5.0 |

[1] The organic ester of phosphoric acid employed in Example XII.

Solution A was stirred in the high-speed blender of Example I for 30 seconds at full speed and Solution B was added with continued blending for 1.5 mintues. The ethyl acetate was then stripped off and the emulsion coated as described in Example I and the dried element exposed to the light from a projected positive transparency as in Example II. The exposed element was processed in a manner similar to that of Example I except that the first solution (the color developer solution) had the following composition:

| | | |
|---|---|---|
| NaOH (5% aqueous solution) | ml. | 100 |
| Polyethylene glycol of mol. wt. 4000 | ml. | 10 |
| $Na_2SO_3$, anhydrous | g. | 1 |
| Benzyl alcohol | ml. | 1 |
| 2-methyl-4-(N,N-diethylamino)aniline | g. | 10 |
| Water to 1 liter. | | |

The processed element was washed for 5 min. and dried to give a well-defined, cyan, positive copy of the original transparency.

This example illustrates the use of a single photoinitiator to initiate the polymerization of the ethylenically unsaturated monomer.

EXAMPLE IV

Three separate suspensions of photopolymerizable droplets similar to the suspension described in Example I were prepared. The dye-initiator systems and color formers used in each separate composition were:

(1) Methylene Blue (C.I. Basic Blue 9) (20 mg.)
Triethanolamine (500 mg.)
Cyan color former (2 g.) (as described in Example I)

(2) Safranin Bluish (C.I. Basic Violet 5) (30 g.)
Triethanolamine (100 mg.)
Magenta color former (1 g.) (as described in Example II)

[2] A polymer prepared by copolymerizing 3.4 moles of methylmethacrylate with 1 mole of 1-phenyl-3-methacrylamido-5-pyrazolone. The preparation of the color-forming monomer is disclosed in Procedure A of U.S. Patent 3,163,625, while the copolymerization reaction was carried out in a manner similar to that disclosed in Example II of said patent.

(3) Proflavine (3,6-diaminoacridinium monohydrogen sulfate) (30 mg.)
Triethanolamine (100 mg.)
Yellow color former (4 g.) (as described in Example VIII)

The compositions were coated successively in the order given on a 0.004 inch thick polyethylene terephthalate support as described in Example I, each layer being dried in the dark before application of the next. The resulting photopolymerizable three-layer film was exposed in contact with a continuous tone positive color transparency by the radiation from the incandescent light source of Example I at a distance of 10 inches for 30 seconds. Photopolymerization took place in those droplets which were exposed to light of wavelength corresponding to the absorption of the initiator dye in each layer, i.e., red, green and blue light in the layers containing, respectively, cyan, magenta, and yellow color formers. The exposed three-layer film, after processing as described in Example I, formed a duplicate of the positive transparency in continuous tone and in colors corresponding to those of the original.

Other layer arrangements were found to give essentially equivalent results.

EXAMPLE V

Example IV was repeated except that the three compositions were successively coated on waterproof paper base. The three-layer film was exposed to a positive color transparency containing continuous tone images as described in Example IV and similarly processed. A well-defined, continuous tone print resulted in colors corresponding to those of the original transparency.

EXAMPLE VI

Example V was repeated except that the three-layer film was exposed to the light from a projected color transparency (500 w. projector lamp; 8× enlargment; 2-min. exposure). The exposed three-layer film was developed and dried as described in Example I to give a good enlarged color print corresponding in color to the original transparency.

EXAMPLE VII

A suspension of photopolymerizable droplets similar to that described in Example I was prepared containing 500 mg. of N-phenylglycine as a radical-producing agent in place of triethanolamine. The speed of the system increased such that an exposure of the coated film could be made in a camera (bright sunlight, *f*2, 20 secs.). After processing, as described in Example I, a cyan direct positive picture resulted which was a good representation of the red record of the scene photographed.

EXAMPLE VIII

Suspension of photopolymerizable droplets similar to the suspension described in Example I were prepared. The dye-initiator systems and color formers used in each composition were:

(1) Methylene Blue (C.I. Basic Blue 9) (20 mg.)
N-phenylglycine (1 g.)
Cyan color former (2.5 g.) (as described in Example I)

(2) Safranin Bluish (C.I. Basic Violet 5) (20 mg.)
N-phenylglycine (1 g.)
Magenta color former (1.1 g.) (as described in Example II)

(3) Phenanthrenequinone (200 mg.)
N-phenylglycine (1 g.)
Yellow color former [1] (5 g.)

[1] A polymer prepared by copolymerizing 1.5 moles of 2-ethylhexyl acrylate with 1 mole of 2-methoxy-5-methacrylamio-alpha-benzoylacetanilide. Preparation of the color-forming monomer was similar to the procedures disclosed in Firestine U.S. Patent 2,976,294. The polymerization was carried out by refluxing for one hour in a dimethyl formamide/t-butanol (40/60) solvent using azo-bis-(isobutyronitrile) as a free-radical initiating catalyst.

The suspensions were combined in the proportion of 4:3:5 (cyan:magenta:yellow), gently mixed, and coated on a 0.004 inch thick polyethylene terephthalate support as described in Example I. The coating was dried and then exposed in contact with a continuous-tone positive color transparency by the radiation from a No. 2 Photoflood lamp at a distance of 10 inches for 10 seconds. A duplicate color transparency in continuous tone with definite discernible color separation resulted.

EXAMPLE IX

Example VIII was repeated except that the mixed suspensions were coated on waterproof paper base. The single-layer color sensitive material was exposed to the light from a projected color transparency as described in Example V. Only 30 seconds' exposure was required to give a good 8× enlarged print with definite color separation corresponding to the original transparency.

EXAMPLE X

Three separate suspensions were prepared from the three compositions as described in Example VIII and coated first with the cyan, then the magenta and finally with the yellow composition on a 0.004 inch thick polyethylene terephthalate support as described in Example I, each layer being chill-set, but not dried, before application of the next. The resulting three-layer film was dried and processed as described in Example IV. A good duplicate transparency in continuous tone and in colors corresponding to those of the original resulted after processing and drying.

EXAMPLE XI

A suspension of photopolymerizable droplets is prepared from two solutions as described in Example I. The first solution contains 10 g. of gelatin, 300 ml. of water and 3 g. of a moist diazotized p-aminodiethylaniline zinc chloride salt. The second solution contains 150 ml. of ethyl acetate, 10 g. of pentaerythritol triacrylate, 1 g. of α-naphthol, .05 g. of 9,10-phenanthrenequinone and 0.6 g. of a surfactant of an organic ester of phosphoric acid (Rohm & Haas QS–44 surfactant). The resulting photopolymerizable emulsion is coated and dried to a film as described in Example I. The film is exposed to a positive continuous tone image using the incandescent lamp of Example I for 30 seconds at a distance of 10 inches. It is then processed by passing through the ammonia chamber of a diazo white printer (model 60, type R6A, manufactured by Paragon Revolute, Division of Charles Bruning Co., Inc., Rochester, N.Y.). An orange-colored azo dye develops in areas not hardened by photopolymerization to give a duplicate continuous-tone image.

EXAMPLE XII

A suspension of photopolymerizable droplets is prepared from two solutions as described in Example I. The first solution contains 10 g. of gelatin dissolved in 300 ml. of water. The second solution contains 150 ml. of ethyl acetate, 10 g. of pentaerythritol triacrylate, 2 g. of phloroglucinol, 20 mg. of methylene blue, 200 mg. of triethanolamine and 100 mg. of benzyl alcohol. The resulting photopolymerizable composition was coated and dried to a film as described in Example I. The film is exposed to a positive continuous tone image using the incandescent lamp of Example I for 30 seconds at a distance of 10 inches. It is then processed by treatment for one minute in a solution of 5 g. of 2-aminodiazo-1-naphthol-5-sulphonic acid and 3 g. of sodium hydroxide in 1 liter of water. A maroon-colored azo dye develops in areas not hardened by photopolymerization to give a duplicate continuous tone image.

Photopolymerizable elements may be prepared by applying layers of the compositions of this invention on any suitable support. For example, the cellulosic supports, e.g., cellulose acetate, cellulose triacetate, cellulose mixed esters, etc., may be used. Polymerized vinyl compounds, e.g., copolymerized vinyl acetate and vinyl chloride, polystyrene, and polymerized acrylates may also be mentioned. The film formed from the polyesterification product of a dicarboxylic acid and a dihydric alcohol made according to the teachings of Alles, U.S. Patent 2,779,684 and the patents referred to in the specification of that patent are particularly useful. Other suitable supports are the polyethylene terephthalate/isophthalates of British Patent 766,290 and Canadian Patent 562,672 and those obtainable by condensing terephthalic acid and dimethyl terephthalate with propylene glycol, diethylene glycol, tetramethylene glycol or cyclohexane 1,4-dimethanol (hexahydro-p-xylene alcohol). The films of Bauer et al. U.S. Patent 3,052,543 may also be used. The above polyester films are particularly suitable because of their dimensional stability. In addition to the above transparent supports, it is also useful to coat these photopolymerizable compositions on opaque supports, e.g., paper, especially water-proof photographic paper, thin aluminum sheets, cardboard, etc. Of course various sublayers may be present to anchor the layers to the base as is common in photographic film and plate manufacture.

In place of gelatin as the binder in the dispersing medium, other natural or synthetic water-permeable organic colloid binding agents can be used. Such agents include, water-permeable or water-soluble polyvinyl alcohol and its derivatives, e.g., partially hydrolyzed polyvinyl acetates, polyvinyl ethers, and acetals containing a large number of extra linear —$CH_2CHOH$— groups; hydrolyzed interpolymers of vinyl acetate and unsaturated addition polymerizable compounds, such as maleic anhydride, acrylic and methacrylic acid ethyl esters, and styrene. Suitable colloids of the last-mentioned type are disclosed in U.S. Patents 2,276,322, 2,276,323 and 2,347,811. The useful polyvinyl acetals include polyvinyl acetaldehyde acetal, polyvinyl butyraldehyde acetal and polyvinyl sodium o-sulfobenzaldehyde acetal. Other useful colloid binding agents include the poly-N-vinyl lactams of Bolton U.S. Patent 2,495,918, the hydrophilic copolymers of N-acrylamidoalkyl betaines described in Shacklett U.S. Patent 2,833,650 and hydrophilic cellulose ethers and esters.

When it is desired to add a binder to the dispersed phase, useful materials include the polymerized methyl methacrylate resins, polyvinyl acetals, such as polyvinyl butyral and polyvinyl formal, vinylidene chloride copolymers (e.g., vinylidene chloride/acrylonitrile, vinylidene chloride/methacrylate and vinylidene chloride/vinylacetate copolymers), synthetic rubbers (e.g., butadiene/acrylonitrile copolymers, and chloro-2-butadiene-1,3-polymers), cellulose esters (e.g., celulose acetate, cellulose acetate succinate and cellulose acetate butyrate), polyvinyl esters (e.g., polyvinyl acetate/acrylate, polyvinyl acetate/methacrylate and polyvinyl acetate), polyvinyl chloride and copolymers (e.g., polyvinyl chloride/acetate), polyurethanes, polystyrene, etc. Generally about 0–20 parts by weight of binder are added per 100 parts by weight of photopolymerizable material. When materials such as the above are incorporated in the dispersed phases, they may act as viscosity modifiers. For example, the viscosity of the droplets may be increased to a point near a "threshold" value whereby an additional increase in viscosity through polymerization may effect a very noticeable change in some physical or chemical property.

Other useful polymerizable binders for the dispersed phase are disclosed in assignee's copending application of Schoenthaler, filed Apr. 27, 1965, Ser. No. 451,300. These unsaturated polymers can be cross-linked or can be grafted to by growing monomer chains, thus producing an increased physical effect, particularly a greater hardening of the dispersed droplet.

Suitable free-radical initiated, chain-propagating addition polymerization ethylenically unsaturated compounds include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Patent 2,927,022, issued Mar. 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester structures. The following specific compounds are further illustrative of this class; unsaturated esters of alcohols, preferably polyols and particularly such esters of the α-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200–500, and the like; vinyl esters such as divinyl succinate, divinyl adipate, divinyl phthalate and divinyl terephthalate; styrene and derivatives thereof and unsaturated aldehydes, such as sorbaldehyde (hexadienal). An outstanding class of these preferred addition polymerizable components are the esters of α-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional monomers can also be used. In addition, the polymerizable, ethylenically unsaturated polymers of Burg U.S. Patent 3,043,805, Martin U.S. Patent 2,929,710 and similar materials may be used alone or mixed with other materials.

In the two component initiating system, the component (a) which is capable of being raised to an activated state by actinic radiation is preferably a cyanine, carbocyanine, merocyanine, or photoreducible dye. The various cyanine and related dyes have been well known in photography for many years and include such dyes as 3 - ethyl - 5 - (2-ethyl-1-benzoxazylidene-β-methyl ethylidene)-2-thio-2,4-(3,5)oxazoledione (prepared as described in Example 16 of Kendall, U.S. Patent 2,272,163, and dyes of the following formulae:

A.

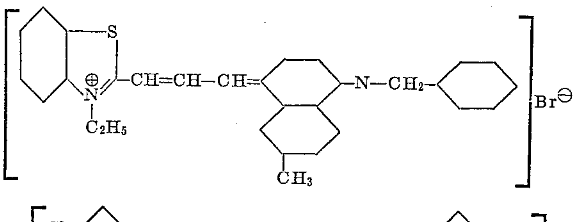

B.

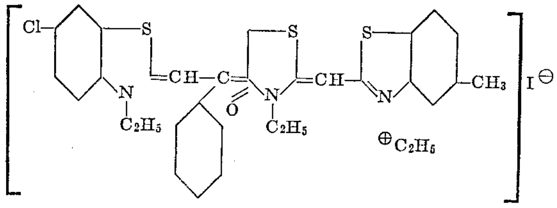

and

C. 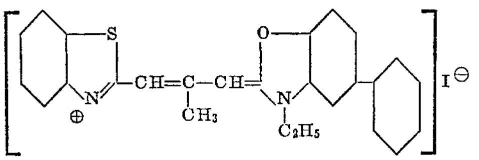

Suitable photoreducible dyes have been disclosed more recently, e.g., in U.S. Patents 2,850,445 and 2,875,047. These photoreducible dyes may be of the cyanine and related type but also include such dyes as Rose Bengal (C.I. Acid Red 94), Safranin Bluish (C.I. Basic Violet 5), Proflavine (3,6-diaminoacridinium monohydrogen sulfate), Methylene Blue (C.I. Basic Blue 9), Erythrosin B (C.I. Acid Red 51) and Thionine (Lauth's Violet, C.I. 52000). Any of these dyes may be used in combination with one another and it is especially useful to employ dye mixtures in systems wherein panchromatic response is desired. A specific combination of dyes which has proven efficient in heterogeneous photopolymerization is, e.g., the dye prepared according to Example 16 of Kendall, U.S. Patent 2,272,163 (named above), Erythrosin B and the dye of the formula A given above. Also useful are combinations of one or more of the above dyes with quinone type compounds, e.g., phenanthrenequinone in combination with the dye prepared according to Example 16 of Kendall, U.S. Patent 2,272,163.

The other component (b) of the initiating system, the radical-producing agent, has been best exemplified by compounds, such as triethanolamine, N-phenylglycine, 5,5-dimethyl-1,3-cyclohexanedione and carbon tetrabromide. Other radical-producing agents are also useful, such as 6-Br-piperonal-N,N-dimethylaniline, ascorbic acid, allyl thiourea, sarcosine, N,N-dimethylglycine, N,N-diethylglycine, tri-n-hexylamine, tri-n-octylamide, diethylcyclohexylamine, disodium salt of ethylenediamine tetraacetic acid, etc.

Other photoinitiator systems are those which produce free radicals without the need of the additional component (b) when activated by actinic light. These include the substituted or unsubstituted polynuclear quinones which are compounds having two intracyclic carbonyl groups attached to intracyclic carbon atoms in a conjugated carbocyclic ring system and are thermally inactive at or below 185° C. Suitable such initiators include 9,10-anthraquinone, 1-chloroanthraquinone, 2-chloroanthraquinone, 2-methylathraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone α-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in Plambeck U.S. Patent 2,760,863 and include vicinal ketaldonyl compounds, such as diacetyl, benzil, etc., α-ketadonyl alcohols, such as benzoin, pivaloin, etc., acyloin ethers, e.g., benzoin methyl and ethyl ethers, etc., α-hydrocarbon substituted aromatic acyloins, including α-methylbenzoin, α-allylbenzoin, and α-phenylbenzoin. All of these photoinitiators which have this combined feature may be used as component (a) in the two-component system.

Since the elements of this invention are for use in a photopolymerizable process, it is obvious that they should be stable against thermally initiated polymerization. Suitable thermal polymerization inhibitors that can be used in photopolymerizable compositions include p-methoxyphenol, hydroquinone, and alkyl- and aryl-substituted hydroquinones and quinones, tert-butyl catechol, pyrogallol, copper resinate, naphthylamines, β-naphthol, cuprous chloride, 2-6-di-tert-butyl p-cresol, phenothiazine, pyridine, nitrobenzene and di-nitrobenzene. Other useful inhibitors include p-toluquinone and chloranil and thiazine dyes, e.g., Thionine Blue G (C.I. Basic Blue 25), Methylene Blue B (C.I. Basic Blue 9) and Toluidine Blue O (C.I. Basic Blue 17). In the particularly preferred embodiments containing certain dye or quinone-type photoinitiators, however, no thermal inhibitor is required since their initiators have a dual function and, in the dark, serve as thermal inhibitors.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps. One of the particular advantages of the present invention, in its preferred embodiment, is the extension of spectral sensitivity into the visible region. Since relatively high speeds for photopolymerizable systems have also been achieved, the more important light sources are those of moderate intensity which yield a high percentage of radiation in the visible spectrum, e.g., tungsten filament sources such as projection lamps. In one of the working examples, there is disclosed an element of sufficient speed for camera exposure with bright sunlight.

The image formed by exposure of a heterogeneous system of this invention depends upon the differential polymerization of the individual droplets in the dispersed phase. Such differences may make the image visible without further treatment, e.g., it is often possible to see a visible relief image. Also, the differences in degree of polymerization of the droplets may cause an imagewise differentiation in light reflectivity of the surface of the element, index of refraction, etc. With a translucent or semitransparent element, polymerization may result in imagewise differences in light scattering which can be detected upon projection of the image or by the use of Schlieren optics. Useful color formers are those well known in art of color photography, especially those prepared by copolymerizing vinyl color-forming monomers with noncolor-forming, hydrophobic vinyl monomers. The resultant copolymers are dispersible in aqueous solutions and are quite resistant to migration within a coated layer or between layers in multilayer elements. Suitable color formers are disclosed in Firestine, U.S. Patent 2,976,294, Firestine and Umberger U.S. 3,163,625 and in Assignee's copending application Umberger Ser. No. 419,227, filed Dec. 17, 1964. Other useful color formers are those made nonmigratory by attaching a long-chain hydrocarbon radical to the color-forming nucleus, such as described in U.S. Patents 2,179,239; 2,186,719; 2,186,732; 2,186,849 and 2,186,851.

Useful color-developing agents are p-aminodiethylaniline hydrochloride, acetamido-p-phenylenediamine, chlor-p-phenylenediamines, monoethyl-p-phenylenediamine, p-aminodimethylaniline, p-aminodibutylaniline, N-p-aminophenylenepiperidine, 1,2,5-toluylenediamine, 2-amino-5-diethylaminotoluene, p-amino-N-phenylmorpholine, N-methyl-N-hydroxyethyl-p-phenylenediamine, N-butyl-N-hydroxyethyl-p-phenylenediamine, 2-amino-5-(N-butyl-N-hydroxyethyl)aminotoluene, β-gamma-dihydroxypropyl-p-phenylenediamine, 1,2,3,4-tetrahydro-6-aminoquinoline, 1,2,3,4-tetrahydro-6-aminoquinoxaline, and the p-phenylene diamine derivatives of U.S. Patent 2,163,155.

Although not essential, it is preferred that a surfactant be employed in dispersing the droplets. Such surfactants include alkylated sulfonic acid, organic esters of phosphoric acid, benzyl alcohol, octyl alcohol, lauryl alcohol, sodium lauryl sulphate, sulphonated derivatives of fatty acid amides, the condensation products of octyl phenol and sorbitan monolaurate with polyethylene oxide, etc.

Another optional ingredient is a plasticizer which may be added to the dispersed phase. A plasticizer, alone or in combination with a binder for the dispersed phase, is believed to assist both the rate and extent of photopolymerization. Useful plasticizers include diisobutyl phthalate, triethylene glycol diacetate, dimethyl sulfoxide, polyethylene glycol succinates, etc.

In some instances, it has been found advantageous to dissolve the monomer in a solvent which is removable by evaporation after dispersion but before coating. Low-boiling solvents which are water immiscible are most suitable and include esters (e.g., ethyl formate, ethyl acetate, propyl acetate, n-butyl acetate, ethyl butyrate), hydrocarbons (e.g., benzene), chlorinated hydrocarbons (e.g., chloroform, methylene chloride) and ethers (e.g., diethyl ether). Certain dispersion techniques allow the use of water-miscible solvents; such solvents are frequently good emulsifiers, e.g., ethanol.

In color-photographic embodiments, this invention may utilize either additive or subtractive color systems, although the examples are directed toward the preferred subtractive process. Various layer arrangements are possible with various combinations of light sensitivity and color former within the given layers. The products, as presently developed, are most useful in making excellent continuous-tone color prints, by contact or enlargement. A three-color product contained within a single layer has been demonstrated which generally contains equal amounts of the three different color formers. With greater speeds, the system could find a variety of other photographic uses including products which are practical for use in cameras.

The primary advantage of the heterogeneous photopolymerization system of the present invention is the improvement in speed or light-sensitivity relative to the homogeneous system. This improved speed is largely attributable to reduced oxygen sensitivity. Oxygen is known to inhibit photopolymerization but it appears to have little effect in the heterogeneous systems of the present invention, particularly the systems wherein gelatin is used as the binder in the aqueous phase. Oxygen is relatively insoluble in gelatin and has a lower diffusion coefficient in gelatin than in many other binders. The reduced sensitivity to oxygen may explain, in part, the ability of the heterogeneous systems to produce continuous tone reproduction. The reproduction of continuous tones is probably dependent, also, on the variation in sensitivity between dispersed droplets of different sizes. (The preferred dispersion contains droplets having a size of about 0.1–0.5 micron.) This ability of the heterogeneous system to produce continuous tone images makes possible the use of photopolymerization in conventional photographic materials, particularly for contact or enlargement papers. Another advantage is concerned with the light scattering effects. Since the droplet size is such that light scattering appears to occur within the matrix, it is possible to have more absorption of light with a given concentration of initiator. The light-scattering effect (and hence the effective speed) is further enhanced by the addition of specific light-scattering materials such as $TiO_2$.

In the specific applications for color reproduction of the images, as disclosed in the examples, these embodiments employ a combination of dye-bleaching and color-coupler destruction. The initial dye-bleached image is replaced by permanent color formed image, color formation being modulated by the photopolymerization initiated during photobleaching. In principle, the system is faster than either dye-bleach or color-coupler destruction methods by virtue of the increased amplification which results on photopolymerization (i.e., a single photon can initiate photopolymerization to form a chain which can prevent more than one color-former molecule from coupling with developer). In this embodiment, as an initiator dye is bleached, the light attenuation by that dye decreases. For this reason, the system seems to have a wide exposure latitude.

The heterogeneous photopolymerization system of this invention shows no significant low-intensity reciprocity failure, probably because of its relative insensitivity to oxygen. Also, it has been found that stability is excellent, both of the raw stock (unexposed material) and the final images that are produced by this process.

As many apparently widely different embodiments of this invention may be made without departing from the spirit and scope thereof, it is to be understood that the invention is not limited to the specific embodiments thereof except as defined in the following claims.

The embodiments of the invention in which an exclusive property or privilege is claimed are defined as follows:

1. A photopolymerizable dispersion comprising an organic polymeric dispersion medium containing a dispersed phase having a nongaseous ethylenically unsaturated compound with a boiling point above 100° C. at normal pressure, being capable of forming a high polymer by free-radical initiated, chain-propagating addition polymerization and in reactive association with said ethylenically unsaturated compound, a free-radical generating photoinitiator system said dispersed phase containing part of a standard color system said part being incapable of singularly forming a color image, said color system being nonreactive with said unsaturated compound, and (1) a color coupler, color developer, oxidizing-agent system,
(2) diazonium salt, azo dye coupler system,
(3) a leuco dye, oxidizing-agent system, or
(4) a dye, bleaching-agent system.

2. A dispersion as defined in claim 1 where said free-radical generating photoinitiator system comprises a two-component system having (a) a material capable of being activated by actinic radiation, and
(b) a free-radical producing agent initiated by said material in its activated state.

3. A dispersion as defined in claim 1 where said photoinitiator comprises a two-component system having (1) a cyanine dye, carbocyanine dye, merocyanine dye, polynuclear quinone or a photoreducible dye, and
(2) a free-radical producing agent selected from the group consisting of carbon tetrabromide, triethanolamine, N-phenylglycine and 5,5-dimethyl-1,3-cyclohexanedione.

4. A photopolymerizable dispersion as defined in claim 1 where said dispersed phase contains a color coupler as part of said standard color system.

5. An image-forming photopolymerizable element for producing color reproductions which comprises a support and a photopolymerizable dispersion as described in claim 1.

6. An image-forming photopolymerizable element for producing multicolor reproductions which comprises a support and three superimposed layers where each layer comprises an organic polymeric dispersion medium containing a dispersed phase having a nongaseous ethylenically unsaturated compound with a boiling point above 100° C. at normal pressure, being capable of forming a high polymer by free-radical initiated, chain-propagating addition polymerization and in reactive association with said ethylenically unsaturated compound a two-component photoinitiator having (a) a dye capable of being activated by one of the three primary color regions of the visible spectrum, and,
(b) a free-radical producing agent initiated by said dye in its active state, said photoinitiator dye for each layer being activatable by light of only one of the three primary color regions of the visible spectrum and said dispersed phase of each of said layers containing part of a color-forming system which yields a layer color complementary to the portion of said spectrum that activates said initiator dye for the particular layer, said part being incapable of singularly forming a color image.

7. An image-forming photopolymerizable element for producing color reproductions which comprises a support and a layer comprising an organic polymeric dispersion medium containing a dispersed phase having droplets of a nongaseous ethylenicaly unsaturated compound with a boiling point above 100° C. at normal pressure, being capable of forming a high polymer by free-radical initated, chain-propagating addition polymerization and a two-component photoinitiator having (a) dyes capable of being activated by either blue, green or red light of the primary color region of the visible spectrum, and (b) a free-radical producing agent initiated by said dyes in their active state, said dispersed phase being activated by the blue, green and red light of the primary color region of the visible spectrum and wherein each discrete droplet of said phase contains (1) a complete photoinitiator having a dye activated by light of only one of said primary color regions of the visible spectrum, and (2) part of a color-forming system which will form a color complementary to the light of the primary color region that will activate said individual initiator in the particular droplet, said part of the color-forming system being incapable of singularly forming a color image.

8. A process for reproducing a colored image which comprises imagewise exposing the element of claim 6 to polymerize the photopolymer and developing said exposed element by contacting the exposed element with the remaining components of said color system to form a color image defined by the photopolymerized polymer, said development occurring while said element is protected from further actinic radiation.

References Cited

UNITED STATES PATENTS

| | | | |
|---|---|---|---|
| 2,850,445 | 9/1958 | Oster. | |
| 2,875,047 | 2/1959 | Oster | 96—115 XR |
| 3,055,758 | 9/1962 | McDonald | 96—115 XR |
| 3,097,096 | 7/1963 | Oster | 96—115 XR |
| 3,244,518 | 4/1966 | Schwerin et al. | 96—115 XR |

FOREIGN PATENTS

| | | |
|---|---|---|
| 647,584 | 11/1964 | Belgium. |
| 664,794 | 6/1963 | Canada. |

NORMAN G. TORCHIN, *Primary Examiner.*

RONALD H. SMITH, *Assistant Examiner.*

U.S. Cl. X.R.

96—20, 22, 35.1, 90, 91, 115